United States Patent [19]

Ashley

[11] Patent Number: 4,721,901
[45] Date of Patent: Jan. 26, 1988

[54] METHOD AND APPARATUS FOR REFLECTION COEFFICIENT MEASUREMENTS

[75] Inventor: James R. Ashley, Tampa, Fla.

[73] Assignee: Hercules Incorporated, Wilmington, Del.

[21] Appl. No.: 843,312

[22] Filed: Mar. 24, 1986

[51] Int. Cl.[4] .................. G01R 27/06; G01R 25/04
[52] U.S. Cl. ................................. 324/58 B; 324/83 R
[58] Field of Search ............ 324/58 R, 58 B, 58.5 R, 324/58.5 B, 376, 83 R, 83 A

[56] References Cited

U.S. PATENT DOCUMENTS

| | | | |
|---|---|---|---|
| 2,762,972 | 9/1956 | Henning | 324/58 B |
| 4,072,897 | 2/1978 | Takayama | 324/58 B X |
| 4,290,009 | 9/1981 | Sanpei et al. | 324/58 B X |
| 4,499,418 | 2/1985 | Helms et al. | 324/58.5 B X |
| 4,502,028 | 2/1985 | Leake | 324/58 R X |
| 4,520,308 | 5/1985 | Rohde et al. | 324/58.5 R |
| 4,521,728 | 6/1985 | Li | 324/58 R |
| 4,593,246 | 6/1986 | Hill | 324/58 B X |

Primary Examiner—Gerard R. Strecker
Attorney, Agent, or Firm—Seymour Levine; Michael B. Keehan; Edmund C. Ross, Jr.

[57] ABSTRACT

A reflection coefficient phase angle measurement apparatus includes a voltage controlled phase shifter coupled to phase shift a sample of one of the signals incident to and reflected from a waveguide termination. The phase shifted signal sample and a sample of the non-phase shifted signal are phase compared in a phase detector and the sign of the signal resulting from the phase comparison is noted. This sign is compared with the sign of the previous phase comparison to determine a zero crossing. When a zero crossing has not occurred an incrementing signal is added to the phase control signal applied to the voltage controlled phase shifter to alter the phase of the the phase shifted signal sample, and the procedure is repeated until a zero crossing is obtained. The control voltage applied at the zero crossing is established by interpolation and utilized to determine the reflection coefficient phase angle.

9 Claims, 3 Drawing Figures

METHOD AND APPARATUS FOR REFLECTION COEFFICIENT MEASUREMENTS

BACKGROUND OF THE INVENTION

1. Field of the Invention

The invention pertains to microwave impedance measurements and more particularly to the measurement of the complex reflection coefficient at the input port of a microwave network.

2. Description of the Prior Art

In the early days of microwave engineering impedance measurements were performed with the utilization of a slotted section of transmission line. A probe moveable along the slot obtained the positions of the voltage minimums and the ratio of maximum to minimum voltage of the standing wave along the line. From this information the magnitude and phase angle of the reflection coefficient (complex reflection coefficient) of the load impedance was determined and with additional computation the terminating impedance established. Standing wave measurements on a slotted section must be performed one frequency at a time. Consequently, the determination of the impedance or waveguide termination over a broad band of frequencies required repetitive measurements at selective frequencies. This procedure was tedious and in many instances the frequency selection bypassed resonant frequencies of the termination.

An early apparatus for impedance measurements over a continuous frequency band was disclosed in U.S. Pat. No. 2,762,972 issued to Henning and assigned to the assignee of the present invention. In this device the microwave source, as for example a reflex klystron, was mechanically tuned over a specified frequency range by a servo mechanism. The output signal of the klystron was launched on a main waveguide section which was coupled to two appropriately spaced auxiliarly waveguides via cross-guide directional couplers. The first of these auxiliary guides was terminated in a short circuit and a probe on a carriage servo controlled with the tuning mechanism, was inserted in the guide and arranged to track the maximum of the standing wave. The second wave guide was terminated with the test load. A series of probes were inserted in a slotted section of the second waveguide with spacings of one-eighth of a wave length therebetween, and these probes were mechanically coupled for movement with the carriage of the probes in the first auxiliary waveguide in a manner to maintain one probe, the second from the load, a quarter wave length from the test load and to maintain the one-eighth wave length spacing between probes as the frequency changes. In this arrangement the amplitudes of the signals detected by the four probes provide sufficient information for the determination of the complex reflection coefficient of the test load, and thereby its impedance. Though an improvement over the manual test procedure, this system was mechanically cumbersome and did not provide highly accurate impedance measurements over a broad frequency band.

With the advent of high directivity directional couplers and the development of the backward wave oscillator (BWO) rapid reflection coefficient measurements over a wide frequency bandwidth could be made with significantly improved accuracies. In this equipment a BWO was coupled to a waveguide that was terminated with the device under test (DUT). Directional couplers included in the waveguide assembly provided samples of the incident and reflected waves to detector circuitry. Voltage amplitudes of the incident and reflected waves were then coupled to a ratio detector to establish the instantaneous magnitude of the reflection coefficient. Coupling this instantaneous reflection coefficient magnitude and the sweep voltage of the BWO to the x and y terminals of an oscilloscope or recorder provided a visual representation of the reflection coefficient magnitude as a function of frequency. Though such a system provides valuable information concerning the waveguide termination, due to the lack of the reflection coefficient phase information, it does not provide sufficient data from which the impedance of the load may be determined.

Complex reflection coefficients may be obtained with BWOs by replacing the detector circuitry with appropriately arranged quadrature phase detectors. With this arrangement inphase and quadrature components of the reflected wave relative to the incident wave may be determined. The resulting inphase and quadrature components may then be combined to establish the magnitude and phase of the waveguide termination. In this system the bandwidth of the measurement is limited by the bandwidth of the directional couplers and the quadrature phase detectors.

Another method employed in the prior art utilizes a six port network, having four output ports and two input ports. The detected powers at the four output ports may be combined to determine the input power at the first and second input ports and the real and imaginary parts of the complex power determined from the complex input signal at one input port multiplied by the complex input signal at the second input port. The impedance of the waveguide load is then determined by taking the square root of the sum of the magnitudes of the two input powers, to establish the magnitude of the reflection coefficient, and by taking the ratio of the imaginary complex power to the real complex power, to establish the tangent of the phase angle of the reflection coefficient. This method of computing the reflection coefficient of a waveguide termination may be performed over a broad continuous band, but requires a significant degree of computation and concomitantly significant computation time.

Though methods exist in the prior art for the determination of the impedance or reflection coefficient of a waveguide load, these methods either require extensive computation or provide only the magnitude of the reflection coefficient. There is a clear need for an apparatus that provides the magnitude and phase of the reflection coefficient with the same simplicity as the measurement of the magnitude alone.

SUMMARY OF THE INVENTION

An apparatus for determining the reflection coefficient of a transmission line termination in accordance with the present invention, in addition to having circuitry for determining the magnitude of the reflection coefficient, includes circuitry for determining the phase angle of the reflection coefficient. A sample of the signal incident to the termination is coupled to a voltage controlled phase shifter, phase shifted therein and coupled to a phase detector wherein a phase comparison to a sample of the signal reflected from the termination is performed. The phase detector provides a signal representative of the phase difference between the incident and reflected signals. When a signal representative of a phase difference is detected, a phase incrementing signal is coupled to the phase shift control terminals of the voltage controlled phase shifter for varying the phase thereof. The signal representative of the phase difference between the incident and reflected signals continues to cause a phase variation of the voltage controlled phase shifter until the phases of the phase shifted signal and the signal reflected from the termination are in a predetermined relationship, which may be either zero or ninety degrees. When this condition is established the voltage applied to the phase control terminals of the voltage controlled phase shifter is representative of the phase of the reflection coefficient. This phase information and the amplitude of the reflection coefficient derived from an amplitude measurement of the sampled reflected signal completely determines the complex reflection coefficient of the termination.

DESCRIPTION OF THE PREFERRED EMBODIMENTS

Figure 1:
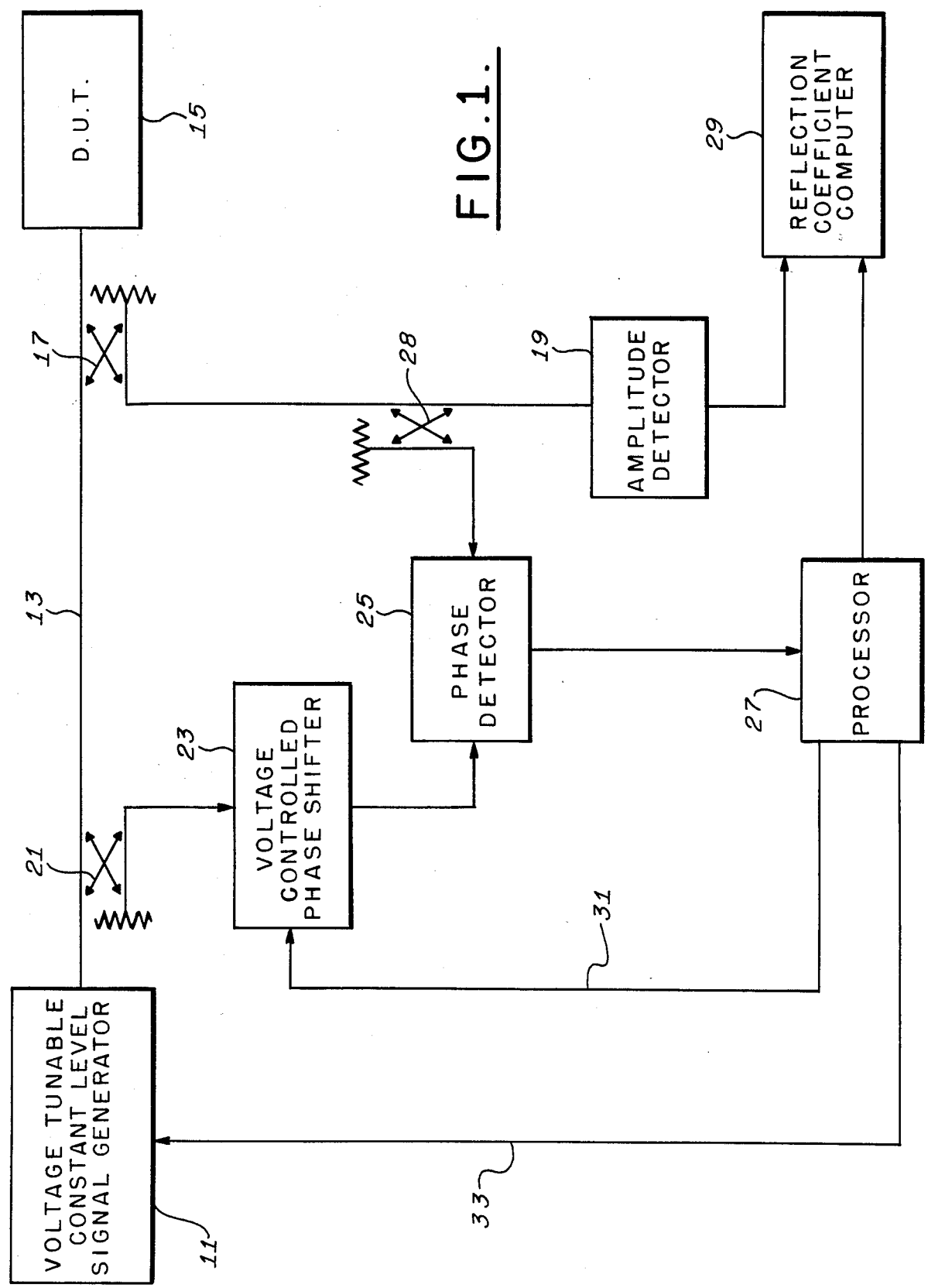
FIG. 1 is a block diagram of a preferred embodiment of the invention.

The functional block diagram of the invention is shown in FIG. 1. A voltage tunable, constant level signal generator 11 couples a signal at a predetermined frequency to a transmission line 13, wherefrom the signal is incident to a device under test (DUT) 15. If the DUT is not impedance matched to the transmission line a signal is reflected therefrom in accordance with the reflection coefficient determined by the impedance mismatch. This reflected signal is sampled by a signal sampler, which maybe a directional coupler 17, and coupled to an amplitude detector 19. Since the level of the incident voltage from the signal generator 11 is known and constant for all signal frequencies the output of the amplitude detector is a measure of the magnitude of the reflection coefficient of the DUT 15 terminating the transmission line 13. This magnitude and the phase of the reflected voltage relative to the phase of the voltage incident to the DUT determines the reflection coefficient.

The phase angle of the reflection coefficient may be determined by providing a sample of the incident signal from a signal sampler, which may be a directional coupler 21 to the signal input to the voltage controlled phase shifter 23 and providing the output signal therefrom to a phase detector 25 for comparison with a sample of the reflected signal incident to the amplitude detector 19 and coupled to the phase detector 25 via a signal sampler which may be a directional coupler 28. Though the sample of the reflected signal is shown in FIG. 1 to be taken from the signal incident to the amplitude detector, those skilled in the art will recognize that a directional coupler may be coupled to the tranmission line 13 and the reflected signal sampled directly therefrom. It should also be recognized by those skilled in the art that the voltage controlled phase shifter may be coupled between the directional coupler 28 and the phase detector 25 to provide phase shifts to the reflected signal samples rather than to the incident signal samples. The output of the phase detector 25 is a signal representative of the phase difference between the signal incident to the DUT 15 and the signal reflected therefrom. This signal is coupled to the processing unit 27 where its amplitude and sign are stored in a scratch pad memory. After the phase detector output signal has been stored, processor 27 increments the voltage at the phase shift control terminal of the voltage controlled phase shifter 23 to vary the phase shift applied to the signal passing therethrough. The output of the phase detector 25 for this incremented phase shift of the sampled incident signal is compared with the signal stored in the scratch pad to determine if the phases of the two input signals to the phase detector 25 are in a predetermined desired relationship, for example having phase differences of zero or ninety degrees. When the processor 27 determines that this phase relationship has occurred it couples a signal representative of a phase of the signal reflected from DUT 15 to a reflection coefficient computer 29, to which the output of the amplitude detector 19 is also coupled, for the computation of the complex reflection coefficient. Simultaneously the coupling of the phase angle of the reflected signal to the reflection coefficient computer 29 the processor 27 couples an incrementing signal to the voltage tunable constant level signal generator level to accomplish a frequency change and the process is repeated.

Figure 2:
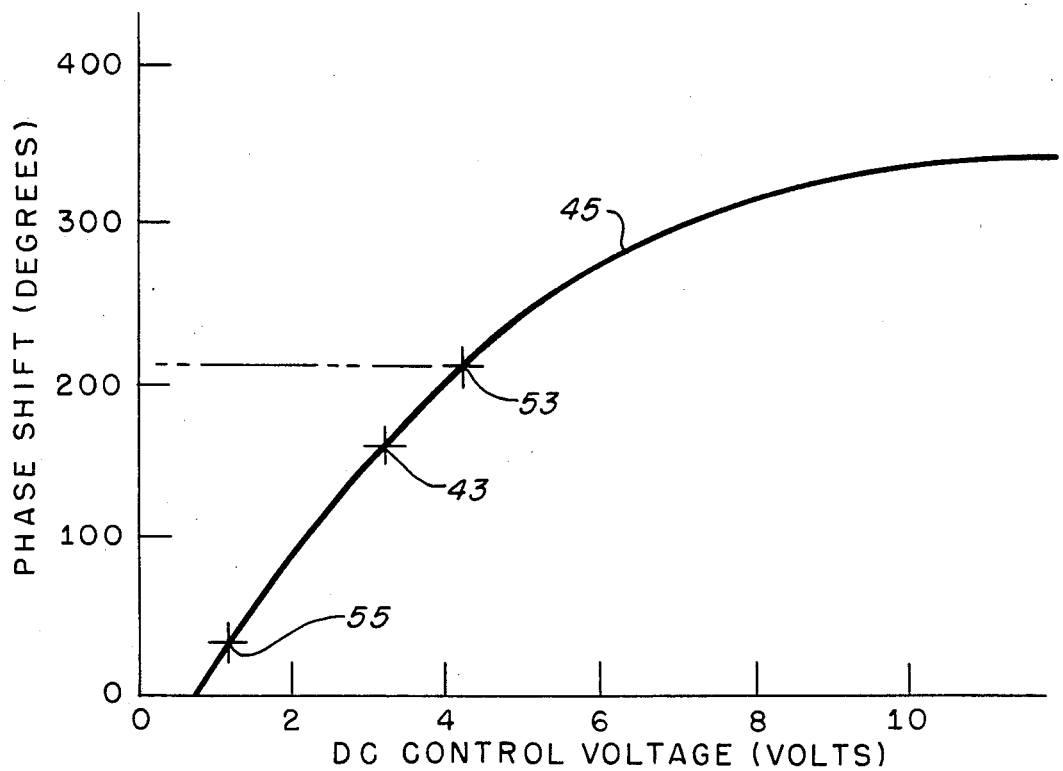
FIG. 2 is a graph of phase shift versus d.c. control voltage for a representative voltage controlled phase shifter that may be utilized in the invention.

As stated above, the voltage controlled phase shifter 23 is a transmission device which allows the relative phase angle of a signal incident thereto to be controlled by a d.c. voltage. Measured characteristics of such a unit are shown in FIG. 2. Phase shifted output signals from the voltage controlled phase shifter 23 may be coupled as reference signals to the phase detector 25 which may be a quadrature phase detector, constructed to provide a signal proportional to cos $\emptyset$, where $\emptyset$ is the difference between the phase angle at the reflection coefficient input terminal of the phase detector 25 and the phase of the signal coupled to the phase detector 25 from the voltage controlled phase shifter 23. It is apparent that the signal output from this phase detector is a d.c. signal which is positive when $\emptyset$ is less than 90° and negative when $\emptyset$ is greater than 90°. The amplitude and sign of this d.c. signal is stored on the scratch pad in the processor 27 as is the voltage applied to the control terminals of the phase shifter 23. The sign of the d.c. output signal resulting from the next phase comparison is compared with the sign on the scratch pad to determine if a change of sign has occurred. If a sign change has not occurred, the amplitude and sign of the last signal at the output terminals of phase detector 25, and the applied phase control votage are stored on the scratch pad, an increment is added to the signal applied to the phase control terminal of phase shifter 23, and another phase measurement is performed. Processor 27 continues to increment the voltage controlled phase shifter 23 in this manner until a sign change is detected. Processor 27 then linearly interpolates between the latest and stored d.c. signals to determine the zero crossing voltage.

To provide accurate phase measurements it is necessary to compensate for phase shifts due to differential line lengths and that caused by system components. This calibration may be accomplished by replacing DUT 15 with a transmission line short circuit to establish a measurement reference phase. The frequency of the signal generator 11 is set by the processor 27 to an initial value. The signal at the initial frequency is then incident to the short circuit and reflected therefrom. Samples of this reflected signal from the directional coupler 17 are amplitude detected by the detector 19 with the output thereof stored in the reflection coefficient computer as a callibration constant for the reflection cofficient magnitude measurements on the DUT.

Figure 3:
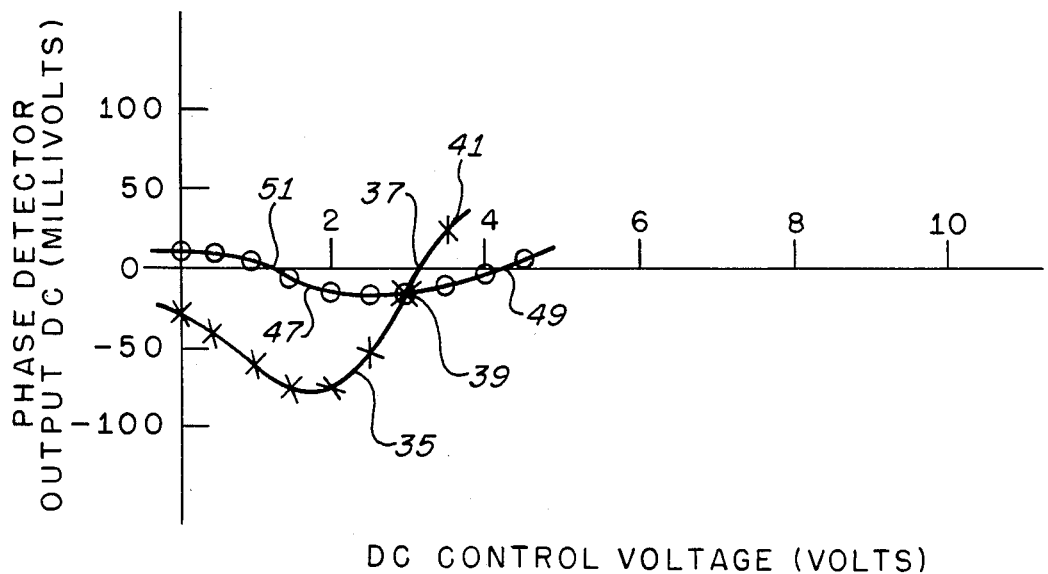
FIG. 3 shows graphs of phase detector output versus d.c. control voltage for a transmission line terminated by a reference short circuit and by a device under test. These graphs are useful for explaining the operation of this invention.

To determine a phase reference setting at each frequency, processor 27 couples a zero voltage instruction via line 31 to the phase controlled terminal of voltage controlled phase shifter 23 and a frequency controlled signal via line 33 to fix the frequency of signal generator 11. The magnitude and sign of the phase detector 25 output signal is stored in a scratch pad memory of the processor 27. Holding the frequency constant, processor 27 then couples a 0.50 volts instruction to the voltage controlled phase shifter 23 and the amplitude and sign of the phase detector 25 output signal is stored in the scratch pad. The signs of the present and previous output signals are then compared and if a change has not occurred the first entry is erased, the instruction to the voltage controlled phase shifter 23 is incremented by another 0.50 volts and the sign of the phase detector 25 output signal is compared to the sign of the previous output signal entered on the scratch pad. This sequence is continued until a sign change is detected. Curve 35 in FIG. 3 is a plot of a phase detector output versus the d.c. voltage applied to the phase controlled terminals of the voltage controlled phase shifter 23. This plot indicates that zero crossing 37 occurs between point 39 and point 41, between 3.00 volts and 3.50 volts respectively. The coordinates of these points are stored in the processor 27 which performs a simple linear interpolation to determine the control voltage at the cross over point 37, for the example given 3.23 volts. This translates to point 43 on the curve 45 in FIG. 2, corresponding to a reference phase shift of 163 degrees. The processor 27 stores the frequency and reference phase therefor and couples a signal via line 33 to the frequency controlled terminals of the signal generator 11 causing the frequency thereof to be incremented to the next value. This process is then repeated until reference phases at all frequencies of interest have been established and stored in the processor.

After all the reference phases have been stored the short is replaced by the DUT 15 and the phase control voltage at the zero crossover are determined at each frequency. Curve 47 in FIG. 3 is a plot of the phase detector 25 output voltage as a function of phase control voltage applied to the voltage controlled phase shifter 23 for one DUT 15. Two zero crossovers are shown, one zero cross over 49 occurring for 4.23 volts applied to the phase control terminals of phase shifter 23 and the other zero cross over 51 occurring at 1.25 volts applied to the phase control terminals. These crossovers respectively translate to points 53 and 55 on the curve 45 of FIG. 2 which correspond respectively to 213 degrees and 33 degrees of phase shift from the phase shifter 23 to provide a null at the output of phase detector 25. Either zero crossing may be utilized to determine the reflection coefficient phase angle of DUT 15. Care must be taken however to take into account the order of the null considered. When the phase detector 25 is of the quadrature type, the output signal is zero whenever the phase difference of the input signals is an odd multiple of 90 degrees, i.e. $(2n+1)\pi/2$. Consequently, $\phi_{DUT}=(n-m-1)\pi+(\phi_R-\phi_S)$, where $\phi_R$ and $\phi_S$ are the phase shifter values determined for the short circuit and DUT terminations respectively, and n and m are the respective null orders. Consider that the phase shift settings 43 and 53 establish zero order nulls for the phase detector that is, m=n=0, for both measurements. Since the phase angle reflection coefficient for a short circuit is equal to $-180$ degrees the phase angle of the reflection coefficient of the DUT is given by $\phi_{DUT}=-180°+50°=-130°$. Since a zero order null was assumed for the zero crossing 49, the zero crossing 51 must be a $(-1)$ order null for which, utilizing the values given above, the $\phi_{DUT}=(0+1-1)180°-130°=-130°$.

While the invention has been described in its preferred embodiments, it is to be understood that the words which have been used are words of description rather than limitation and that changes may be made within the purview of the appended claims without departing from the true scope and spirit of the invention in its broader aspects.

What is claimed is:

1. A reflection coefficient measuring apparatus of the type including transmission means for signal propagation having signal input port means to receive signals for propagation, end port means adapted for coupling to devices to be tested, reflected signal sampling means coupled to the transmission means for providing samples of signals reflected from the end port means and detector means coupled to the reflected signal sampling means for determining reflected signal amplitudes further comprising:

incident signal sampling means coupled to said transmission means for providing samples of signals incident to said end port means;

phase detector means having first input means coupled to receive samples of said reflected signals from said reflected signal sampling means and second input means for providing a null at an output terminal thereof when a predetermined phase angle relationship is achieved between signals coupled to said first and second input means, a signal with a positive polarity at said output terminal when a phase angle of one of said signals is greater than a phase angle said signal other than said one by said predetermined phase angle relationship, and a signal with a negative polarity at said output terminal when said one signal is less than said signal other than said one by said predetermined phase angle relationship;

phase shift means coupled between said incident signal sampling means and said second input means of said phase detector means and having phase shift control terminals for phase angle shifting signals propagating between said incident signal sampling means and said second input means of said phase detector means in accordance with phase angle incrementing signals coupled to said phase shift control terminals, whereby a phase relationship between said signals incident to and reflected from said end port means is determinable from a phase angle setting of said phase shift means when said predetermined phase relationship is achieved;

processor means coupled to said output terminal of said phase detector means, said phase shift control terminals of said phase shift means, and said reflection coefficient determining means for providing said phase angle incrementing signals until a null crossover is indicated by a signal polarity change at said output terminal of said phase detector means and for providing a final phase angle increment signal representative of said phase shift means phase angle setting for a null at said output terminal of said phase detector means to said reflection coefficient determining means by interpolating for a crossover between a signal polarity change when no increment signal produces said null; and means coupled to receive said final phase angle incrementing signal from said processor means and to receive said reflected signal amplitude from said detector means for determining magnitude and phase angle of said reflection coefficient of a device coupled to said end port.

2. A reflection coefficient measuring apparatus in accordance with claim 1, wherein said reflected signal sampling means and said incident signal sampling means, are directional couplers.

3. A reflection coefficient measuring apparatus in accordance with claim 1 wherein said predetermined phase relationship is ninety degrees.

4. A reflection coefficient measuring apparatus in accordance with claim 1 wherein said predetermined phase relationship is zero degrees.

5. A method for determining the reflection coefficient of a transmission line termination comprising the steps of:

coupling an incident signal having a phase angle and a constant amplitude to said transmission line, said incident signal being incident to said termination;

sampling said incident signal to provide an incident signal sample having a phase angle representative of said phase angle of said incident signal;

sampling a reflected signal having a phase angle and an amplitude reflected from said termination to provide a reflected signal sample having a phase angle and an amplitude representative of said phase angle and said amplitude of said reflected signal, respectively;

coupling one of said incident and reflected signal samples to a voltage controlled phase shifter having phase shift control terminals for propagation therethrough to emerge at an output port thereof as a phase shifted signal having a phase angle shifted relative to said phase angle of said one signal sample in accordance with a phase shift control voltage applied to said phase shift control terminals;

comparing said phase angle of said signal sample other than said one to said phase angle of said phase shifted signal in a phase detector, thereby performing a phase comparison, said phase detector providing a phase difference signal at an output terminal that is representative of phase difference between said signal sample other than said one and said phase shifted signal, said phase difference signal being a null when differences between phase angles of said signal sample other than said one and said phase shifted signal equal a predetermined angle;

incrementing said phase shift control voltage when said phase difference signal is not a null and repeating said phase comparison;

comparing a phase difference signal at said output terminal of said phase detector obtained from a phase comparison to a phase difference signal at said output terminal of said phase detector obtained from a next previous phase comparison to check for a null crossover;

generating a phase shift increment when a null crossover is not detected;

applying said phase shift increment voltage to said phase shift control terminals thereby providing an incremental phase shift to said one signal sample;

repeating phase comparisons and incremental phase shifting until a null crossover is detected;

determining a phase shift control voltage at said null crossover by interpolating between phase control voltages producing signals at said output terminal of said phase detector on either side of said null; and determining said reflection coefficient from said control voltage at said null crossover and said reflected signal sample.

6. A reflection coefficient measuring apparatus of the type including transmission means for signal propagation having signal input port means to receive signals for propagation, end port means adapted for coupling to devices to be tested, reflected signal sampling means coupled to the transmission means for providing samples of signals reflected from the end port means and detector means coupled to the reflected signal sampling means for determining reflected signal amplitudes further comprising incident signal sampling means coupled to said transmission means for providing samples of signals incident to said end port means;

phase detector means having first input means coupled to receive samples of said input signals from said input signal sampling means and second input means for providing a null at an output terminal thereof when a predetermined phase angle relationship is achieved, a signal with a positivie polarity at said output terminal when a phase angle of one of said signals at said first and second input means exceeds a phase angle of said signal other than said one by said predetermined phase angle relationship, and a signal with a negative polarity at said output terminal when said one signal is less than a phase angle of said signal other than said one by said predetermined phase angle relationship;

phase shift means coupled between said reflected signal sampling means and said second input means of said phase detector means having phase shift control terminals for phase angle shifting signals propagating between said reflected signal sampling means and said second input means of said phase detector means in accordance with phase angle incrementing signals coupled to said phase shift control terminals, whereby a phase relationship between said signals incident to and reflected from said end port means is determinable from a phase angle setting of said phase shift means when said predetermined phase relationship is achieved;

processor means coupled to said output terminal of said phase detector means, said phase shift control terminals of said phase shift means, and said reflection coefficient determining means for providing said phase angle incrementing signals until a null crossover is indicated by a signal polarity change at said output terminal of said phase detector means and for providing a final phase angle increment signal representative of said phase shift means phase angle setting for a null at said output terminal of said phase detector means to said reflection coefficient determining means by interpolating for a crossover between a signal polarity change when no increment signal produces said null; and means coupled to receive said final phase angle incrementing signal from said processor means and to receive said reflected signal amplitude from said detector means for determining magnitude and phase angle of said reflection coefficient of a device coupled to said end port.

7. A reflection coefficient measuring apparatus in accordance with claim 6, wherein said reflected signal sampling means and said incident signal sampling means, are directional couplers.

8. A reflection coefficient mesuring apparatus in accordance with claim 6 wherein said predetermined phase relationship is ninety degrees.

9. A reflection coefficient measuring apparatus in accordance with claim 6 wherein said predetermined phase relationship is zero degrees.

* * * * *